(12) United States Patent
Kubo et al.

(10) Patent No.: US 12,360,165 B2
(45) Date of Patent: Jul. 15, 2025

(54) MACHINE LEARNING APPARATUS AND MACHINE LEARNING METHOD

(71) Applicant: Mitsubishi Electric Corporation, Tokyo (JP)

(72) Inventors: Takumi Kubo, Tokyo (JP); Takanobu Inagaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 588 days.

(21) Appl. No.: 17/775,318

(22) PCT Filed: Jan. 9, 2020

(86) PCT No.: PCT/JP2020/000425
§ 371 (c)(1),
(2) Date: May 9, 2022

(87) PCT Pub. No.: WO2021/140605
PCT Pub. Date: Jul. 15, 2021

(65) Prior Publication Data
US 2022/0397608 A1 Dec. 15, 2022

(51) Int. Cl.
*G01R 31/34* (2020.01)
*G05B 23/02* (2006.01)

(52) U.S. Cl.
CPC ....... *G01R 31/343* (2013.01); *G05B 23/0227* (2013.01); *G05B 23/027* (2013.01); *G05B 23/0286* (2013.01)

(58) Field of Classification Search
CPC .. G01R 31/343; G01R 31/34; G05B 23/0227; G05B 23/0224; G05B 23/0218;
(Continued)

(56) References Cited

U.S. PATENT DOCUMENTS

2019/0258945 A1* 8/2019 Fukuda ............. G05B 23/0243
2019/0291270 A1* 9/2019 Kiyama ............... B25J 11/0065

FOREIGN PATENT DOCUMENTS

| CN | 108152738 A | 6/2018 |
| JP | 2019-139375 A | 8/2019 |
| JP | 2019-144174 A | 8/2019 |

OTHER PUBLICATIONS

Office Action mailed on Aug. 31, 2024 for the corresponding Chinese patent application No. 202080091768.8 and English translation, 28pp.

(Continued)

*Primary Examiner* — Manuel L Barbee
(74) *Attorney, Agent, or Firm* — XSENSUS LLP

(57) ABSTRACT

A machine learning apparatus that learns an alarm factor in a motor drive device includes a state observation unit that obtains a feature amount as a state variable from the motor drive device and an alarm factor as label data, the alarm factor corresponding to the feature amount, and a learning unit that generates a learning model for inferring a new alarm factor corresponding to a new feature amount, from a dataset created on a basis of a combination of the state variable and the label data. The feature amount includes at least one of a detected current value detected from the motor, a speed command value specifying a rotational speed of the motor, an output voltage value output to the motor, an estimated speed value of the motor, and a detected speed value of the motor.

9 Claims, 8 Drawing Sheets

(58) Field of Classification Search
CPC .............. G05B 23/0205; G05B 23/027; G05B 23/0286; G05B 23/0289; G05B 23/0294; G05B 23/0297; H02K 11/20
See application file for complete search history.

(56) References Cited

OTHER PUBLICATIONS

International Search Report and Written Opinion mailed on Mar. 24, 2020, received for PCT Application PCT/JP2020/000425, Filed on Jan. 9, 2020, 11 pages including English Translation.
Office Action mailed on Feb. 27, 2025 for the corresponding Chinese patent application No. 202080091768.8 and an English machine translation, 27pp.

* cited by examiner

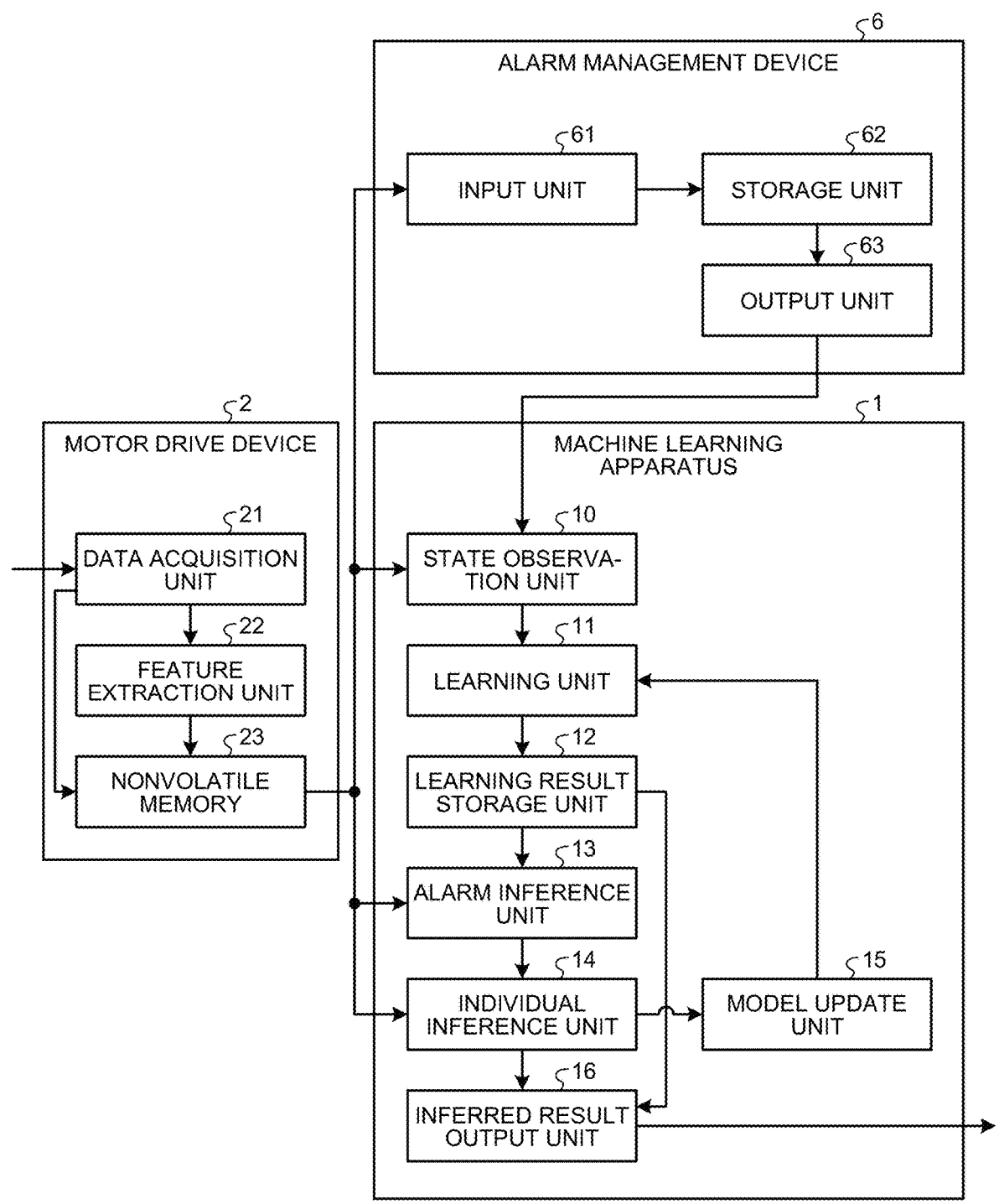

FIG.7

| ALARM DATE AND TIME | GENERATED ALARM | ALARM DETAILS | ALARM FACTOR | ALARM FACTOR RESOLVING PARAMETER |
|---|---|---|---|---|
| 2019/11/2 16:00 | E.OC1 | OVERCURRENT DURING ACCELERATION | ACCELERATION TIME PERIOD SET SHORTER RELATIVE TO LOAD | ACCELERATION TIME PERIOD |
| 2019/10/30 12:00 | E.OC2 | OVERCURRENT AT CONSTANT SPEED | MOTOR SHAFT LOCKED | NONE |
| 2019/9/21 10:00 | E.OC3 | OVERCURRENT DURING DECELERATION | DECELERATION TIME PERIOD SET SHORTER RELATIVE TO LOAD | DECELERATION TIME PERIOD |
| 2019/8/10 17:00 | E.OC1 | OVERCURRENT DURING ACCELERATION | EXCESSIVE TORQUE BOOST VALUE RELATIVE TO DEVICE | TORQUE BOOST SET VALUE |
| 2019/7/10 8:00 | E.OC3 | OVERCURRENT DURING DECELERATION | BROKEN ENCODER WIRE | BROKEN ENCODER WIRE DETECTION |
| 2019/6/2 11:00 | E.OC2 | OVERCURRENT AT CONSTANT SPEED | LOAD INCREASING DURING OPERATION | TORQUE LIMIT VALUE |
| ⋮ | ⋮ | ⋮ | ⋮ | ⋮ |

MACHINE LEARNING APPARATUS AND MACHINE LEARNING METHOD

CROSS-REFERENCE TO RELATED APPLICATION

The present application is based on PCT filing PCT/JP2020/000425, filed Jan. 9, 2020, the entire contents of which are incorporated herein by reference.

FIELD

The present disclosure relates to a machine learning apparatus that learns an alarm factor in a motor drive device that drives a motor, and to a machine learning method.

BACKGROUND

When a motor drive device for driving a motor comes into an alarm state, an alarm factor should be identified before a change to a parameter of the motor drive device, adjustment of a system including the motor drive device, and the like.

A fault diagnosis apparatus described in Patent Literature 1 observes a state variable such as data on a motor drive device at the time of a fault of the device, obtains label data such as repaired part data indicating a repaired part of the motor drive device, and learns the association between the state variable and the label data. Using a result of the learning, the fault diagnosis apparatus infers which part of the motor drive device is out of order.

CITATION LIST

Patent Literature

Patent Literature 1: Japanese Patent Laid-Open Publication No. 2019-144174

SUMMARY

Technical Problem

The technique described in above Patent Literature 1 leans learns the location of a fault in a broken-down component. In the case of a breakdown of a component, for example, such a technique can infer a factor behind the breakdown. Unfortunately, the technique fails to infer an alarm factor caused not by a physical breakdown of a component and the like but by a manner of the use.

The present disclosure has been made in view of the above, and an object of the present disclosure is to provide a machine learning apparatus capable of generating a learning model for inferring an alarm factor caused by the manner of the use.

Solution to Problem

In order to solve the above-mentioned problem and achieve the object, the present disclosure provides a machine learning apparatus to learn an alarm factor in a motor drive device to drive a motor, The machine learning apparatus comprising: a state observation unit and a learning unit. The state observation unit obtains a feature amount as a state variable from the motor drive device and an alarm factor as label data, the alarm factor corresponding to the feature amount. The feature amount includes at least one of a detected current value detected from the motor, a speed command value specifying a rotational speed of the motor, an output voltage value output to the motor, an estimated speed value indicating an estimated rotational speed of the motor, and a detected speed value indicating a detected rotational speed of the motor. The learning unit generates a learning model for inferring a new alarm factor corresponding to a new feature amount, from a dataset created on a basis of a combination of the state variable and the label data.

Advantageous Effect of Invention

The machine learning apparatus according to the present disclosure is capable of generating the learning model for inferring the alarm factor caused by the manner of the use.

BRIEF DESCRIPTION OF DRAWINGS

FIG. 6 illustrates a configuration of the machine learning apparatus according to the embodiment.

FIG. 7 illustrates alarm factors given as examples used by the machine learning apparatus according to the embodiment.

DESCRIPTION OF EMBODIMENT

With reference to the drawings, a detailed description is hereinafter provided of a machine learning apparatus and a machine learning method according to an embodiment of the present disclosure. It is to be noted that this embodiment is not restrictive of the present disclosure.

Embodiment

Figure 1:
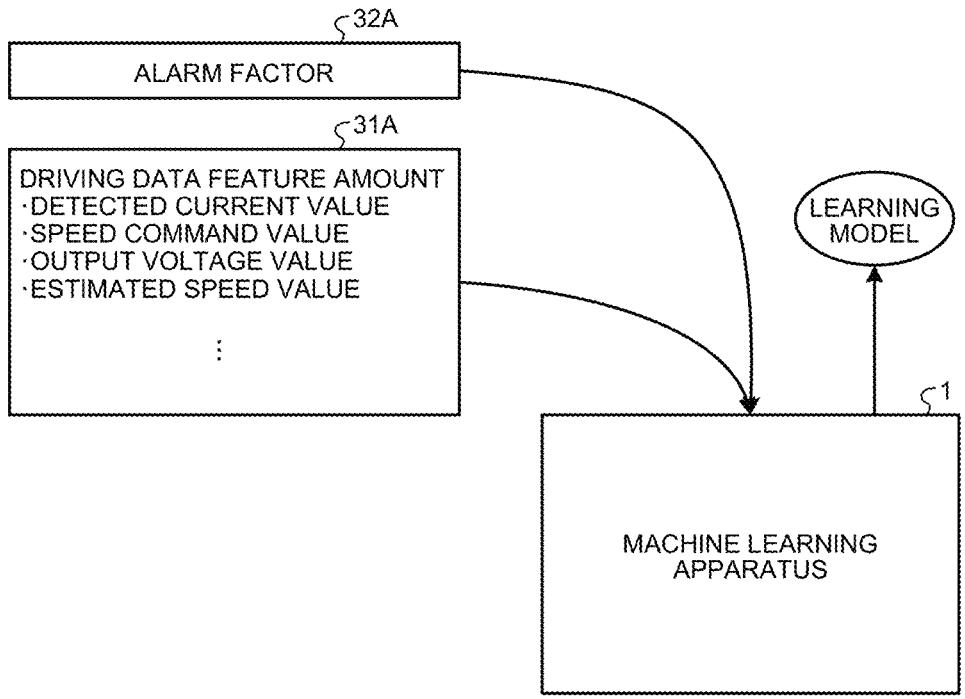
FIG. 1 illustrates processing at a learning stage by a machine learning apparatus according to an embodiment.
Figure 2:
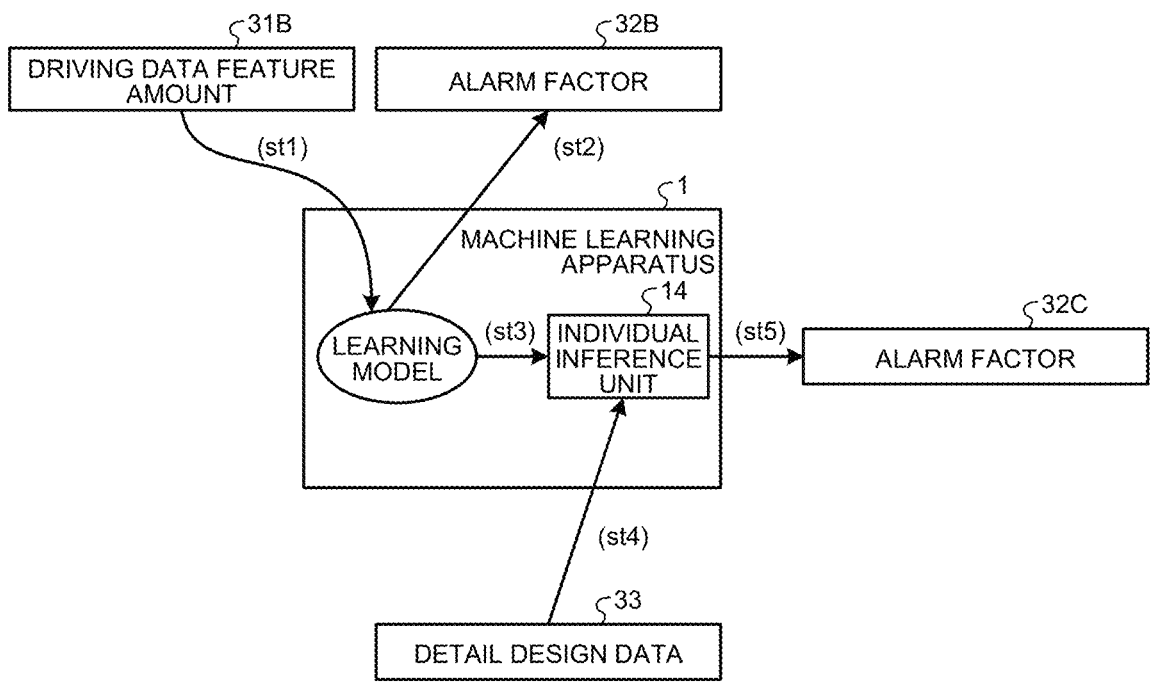
FIG. 2 illustrates processing at an inference stage by the machine learning apparatus according to the embodiment.

FIG. 1 illustrates processing at a learning stage by a machine learning apparatus according to the embodiment. FIG. 2 illustrates processing at an inference stage by the machine learning apparatus according to the embodiment.

The machine learning apparatus 1 learns a state of a motor drive device that drives a motor. The machine learning apparatus 1 is a computer that infers a factor behind an alarm generated by the motor drive device (hereinafter referred to as "alarm factor") with an artificial intelligence (AI) technique and informs a worker of the alarm factor, a parameter that resolves the alarm factor, and others.

As illustrated in FIG. 1, the machine learning apparatus 1 in the learning stage obtains information indicative of the state of the motor drive device that has generated an alarm. The information indicative of the state of the motor drive device that has generated the alarm includes an alarm factors 32A and a driving data feature amount 31A.

The driving data feature amount 31A is an amount of a feature extracted by the motor drive device from physical quantities that the motor drive device has obtained when an alarm has occurred at the learning stage. The alarm factor 32A is an alarm factor at the learning stage and corresponds to the driving data feature amount 31A. The alarm factor 32A is set, for example, by a worker.

The machine learning apparatus 1 learns a learning model that indicates a relationship between the alarm factor 32A and the driving data feature amount 31A, as a state of the motor drive device. In other words, the machine learning apparatus 1 learns the alarm factor 32A that corresponds to the driving data feature amount 31A.

As illustrated in FIG. 2, the machine learning apparatus 1 at the inference stage uses the learning model to infer, from a driving data feature 31B indicating a state of the motor drive device that has generated an alarm, an alarm factor 32B indicating the state of the motor drive device that has generated the alarm. The machine learning apparatus 1 at the inference stage also obtains detail design data 33.

The driving data feature 31B is an amount of a feature extracted by the motor drive device from physical quantities that the motor drive device has obtained when the alarm has occurred at the inference stage. The alarm factor 32B is an alarm factor at the inference stage and corresponds to the driving data feature 31B. The alarm factor 32B is derived by applying the driving data feature 31B to the learning model.

In a description below, at least one of the driving data feature amounts 31A and 31B may be referred to as the feature amount or the driving data feature amount where there is no need to distinguish the driving data feature amounts 31A and 31B from each other. Moreover, at least one of the alarm factors 32A and 32B may be referred to as the alarm factor when there is no need to distinguish the alarm factors 32A and 32B from each other.

The motor drive device obtains the driving data feature amounts 31A, 31B when, for example, the alarm has occurred. The physical quantities that the motor drive device obtains include at least one of a detected current value, a speed command value, an output voltage value, and an estimated speed value. The motor drive device may obtain a detected speed value in place of or in addition to the estimated speed value. The driving data feature amounts 31A, 31B each include at least one of a feature from the detected current values, a feature amount of the speed command values, a feature amount of the output voltage values, a feature amount of the estimated speed values, and a feature amount of the detected speed values.

The feature amount of each physical quantity is, for example, a maximum value, a minimum value, a peak value, or an average value, of each the physical quantity. The physical quantities obtained by the motor drive device are shown in the form of, for example, waveform data.

The detected current value is a current value detected from the motor in driving the motor. The speed command value is a command value specifying a rotational speed of the motor. The output voltage value is a voltage value output to the motor in driving the motor. The estimated speed value is a motor rotational speed estimated in driving the motor. The estimated speed value is based on various command values and detected values, among others. The detected speed value is a motor rotational speed detected in driving the motor.

The detail design data 33 includes at least one of a parameter set value, a driving condition of the motor drive device, and internal data on an amplifier that amplifies power output from the motor drive device. The parameter set value, which is a value set in the motor drive device, is, for example, a motor torque boost set value. The driving condition is, for example, a motor control period. The internal data on the amplifier includes, for example, the number of arms of switching elements.

Among the alarms are overcurrent, overvoltage, overspeed, motor thermal, and inverter thermal, for example. The overcurrent means that a current in the motor is in excess of an allowable current. The overvoltage means that a voltage applied to the amplifier is in excess of an allowable voltage. The over-speed means that a rotational speed of the motor is in excess of an allowable speed. The motor thermal means that a motor temperature is in excess of an allowable temperature. The inverter thermal means that a temperature of an inverter circuit that applies the voltage to the motor is in excess of an allowable temperature.

A description is provided here of machine learning that is performed by the machine learning apparatus 1. The machine learning apparatus 1 extracts, from a data aggregate input to the machine learning apparatus 1, useful rules, knowledge representations, criteria, and others through analysis, outputs a result of extraction, and gains knowledge, thus implementing the machine learning. While there are various machine learning approaches, the machine learning approaches are divided roughly into "supervised learning", "unsupervised learning", and "reinforcement learning".

The machine learning apparatus 1 according to the present embodiment employs a "supervised learning" algorithm. When performing "the supervised learning", the machine learning apparatus 1 obtains many datasets of inputs and results, and learns characteristics that exist in these datasets. Those results are label data, as will be described later. Moreover, the machine learning apparatus 1 acquires a model that infers a result from an input. That is to say, the machine learning apparatus 1 acquires a relationship between the input and the result. The model that infers the result from the input is hereinafter referred to as "learning model". The machine learning apparatus 1 implements the learning model, which infers an output from a result, by means of the algorithm such as Extreme Gradient Boosting (XGBoost) that will be described later.

By performing the supervised learning that enables learning based on specified data and determination of an alarm factor in the motor drive device on the basis of a result of learning, the machine learning apparatus 1 learns a correlation between a feature amount and an alarm factor.

A supervised learning procedure by the machine learning apparatus 1 is dividable into two stages: the learning stage and the inference stage. At the learning stage, the machine learning apparatus 1 learns a correlation between a feature amount and an alarm factor on the basis of training data including the value of a state variable and the value of a target variable. The state variable is used as input data, and the target variable is used as output data. When the value of the state variable is input to the machine learning apparatus 1 provided with the training data, the machine learning apparatus 1 learns outputting the value of the target variable on the basis of the learned correlation. By being provided with many pieces of training data, the machine learning apparatus 1 builds an inference model, namely, a learning model that outputs the value of the target variable for the value of the state variable.

The state variable is the driving data feature 31A or 31B, and the target variable is the alarm factor 32A or 32B. When the state variable is the driving data feature 31A, the target variable is the alarm factor 32A. When the state variable is the driving data feature 31B, the target variable is the alarm factor 32B.

Examples of the state variable include a feature amount of the detected current value and a feature amount of the speed command value, among others. For example, the value of the target variable indicates that "a motor acceleration time period is set shorter relative to a load".

When given the state variable, which is the training data (feature-alarm factor sets), the machine learning apparatus 1 at the learning stage learns the learning model that expresses a correlation between the feature amount and the alarm factor, as described above.

When newly receiving the input of a value of the state variable, the machine learning apparatus 1 at the inference stage uses the learning model to output a value of the target variable corresponding to the value of that new state variable. As illustrated specifically in FIG. 2, the machine learning apparatus 1 receives the new driving data feature 31B that is the value of the new state variable (st1). On the basis of the driving data feature 31B, which is the value of the new state variable, and the learning model that the machine learning apparatus 1 has learned, the machine learning apparatus 1 infers the new alarm factor 32B that is the value of the new target variable (st2). The machine learning apparatus 1 outputs the thus inferred alarm factor 32B to, for example, a display device (not illustrated).

It is to be noted that the feature amount may include a feature amount extracted by the motor drive device during a normal operation. In that case, there is no alarm factor corresponding to the feature extracted during the normal operation.

The machine learning apparatus 1 includes an individual inference unit 14 that is a correction unit for the learning model. The individual inference unit 14 receives the alarm factor 32B, which is an inferred result obtained by the supervised learning, from the learning model (st3). The individual inference unit 14 also receives, from, for example, the motor drive device, the detail design data 33 that is data obtained in the presence of the alarm from the motor drive unit (st4).

On the basis of the alarm factor 32B received from the learning model and the detail design data 33 received from the motor drive device, the individual inference unit 14 corrects the alarm factor 32B that is a result of inference, such that the machine learning provides a more accurate inference result. Specifically, the individual inference unit 14 corrects the alarm factor 32B on the basis of the alarm factor 32B and the detail design data 33 and outputs an alarm factor 32C that is a corrected alarm factor (st5).

Since the individual inference unit 14 corrects the alarm factor 32C that is the inference result, the machine learning apparatus 1 can infer, with high accuracy, even an alarm factor whose characteristic that is not easy to identify in the state variable. The alarm factor 32B that is not easy to identify in the state variable is, for example, a wrong setting of a parameter value.

It is to be noted that the detail design data 33 may include change information indicating, among the parameter set values, a parameter set value changed before an anomalous operation. In that case, the individual inference unit 14 corrects, on the basis of the change information, the alarm factor inferred by the learning model.

In this manner, the machine learning apparatus 1 can readily identify the alarm factor that is the parameter value being wrongly set by the worker. Even in the case of the alarm factor that is the wrongly setting of a parameter set value, the individual inference unit 14 can ascertain which parameter set value has been changed before the anomalous operation if the change information is included in the detail design data 33. As a result, the alarm factor, which is the wrong setting, is identifiable with increased accuracy.

The machine learning apparatus 1 may increase a weight of the alarm factor that corresponds to the parameter set value included in the change information before generating or updating a learning model. When an anomaly occurs and is subsequently resolved by a change to the parameter set value, the machine learning apparatus 1 may generate or update a learning model.

The machine learning apparatus 1 may store an error variable, which is an inference result corrected by the individual inference unit 14, and correct the learning model on the basis of this error variable. In this case, the machine learning apparatus 1 corrects the learning model such that the learning model can calculate an inference result identical with the inference result corrected by the individual inference unit 14. In other words, the machine learning apparatus 1 corrects the learning model such that even in the absence of the correction by the individual inference unit 14, the learning model can calculate the same inferred result as the inference result corrected by individual inference unit 14.

Figure 3:
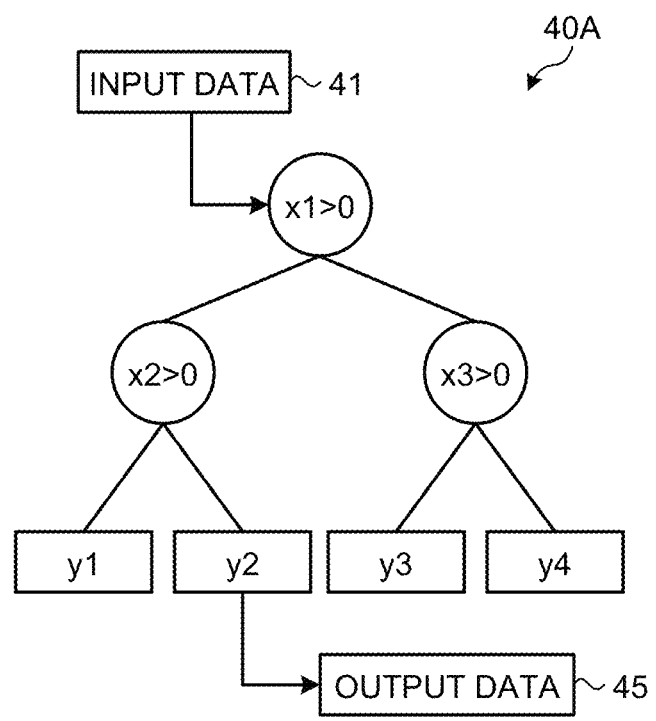
FIG. 3 schematically illustrates an example configuration of a decision tree used by the machine learning apparatus according to the embodiment.

The machine learning apparatus 1 obtains the target variable from the state variables by classification using tree structure of a decision tree. FIG. 3 schematically illustrates an example configuration of a decision tree used by the machine learning apparatus according to the embodiment. The machine learning apparatus 1 adjusts a tree structure depth of the decision tree 40A, thereby adjusting a learning result. The decision tree 40A, which is a regression tree, indicates how an input feature amount finds its way to correct label data through conditional branching.

At a first-layer conditional branch of the decision tree 40A, a determination is made whether or not input data 41, which is a state variable, satisfies $x1>0$. If the input data 41 satisfies $x1>0$ at the first layer, a determination is made at a second-layer conditional branch whether $x2>0$ is satisfied or not. If the input data 41 satisfies $x1\leq0$ at the first layer, a determination is made at a second-layer conditional branch whether $x3>0$ is satisfied or not.

If the input data 41 satisfies $x2>0$ at the second layer, the input data 41 regresses to data y1. If the input data 41 satisfies $x2\leq0$ at the second layer, the input data 41 regresses to data y2.

If the input data 41 satisfies $x3>0$ at the second layer, the input data 41 regresses to data y3. If the input data 41 satisfies $x3\leq0$ at the second layer, the input data 41 regresses to data y4.

Suppose the data y2, for example, is output data 45 in this case. In other words, suppose the data y2 is a target variable (label data). The machine learning apparatus 1 generates the learning model by setting the decision tree 40A that enables the state variable to regress to the data y2.

The machine learning apparatus 1 may use the procedure called Extreme Gradient Boosting as an application for a supervised learning procedure using decision trees. The Extreme Gradient Boosting refers to ensemble learning that is a combination of gradient boosting and a random forest.

Figure 4:
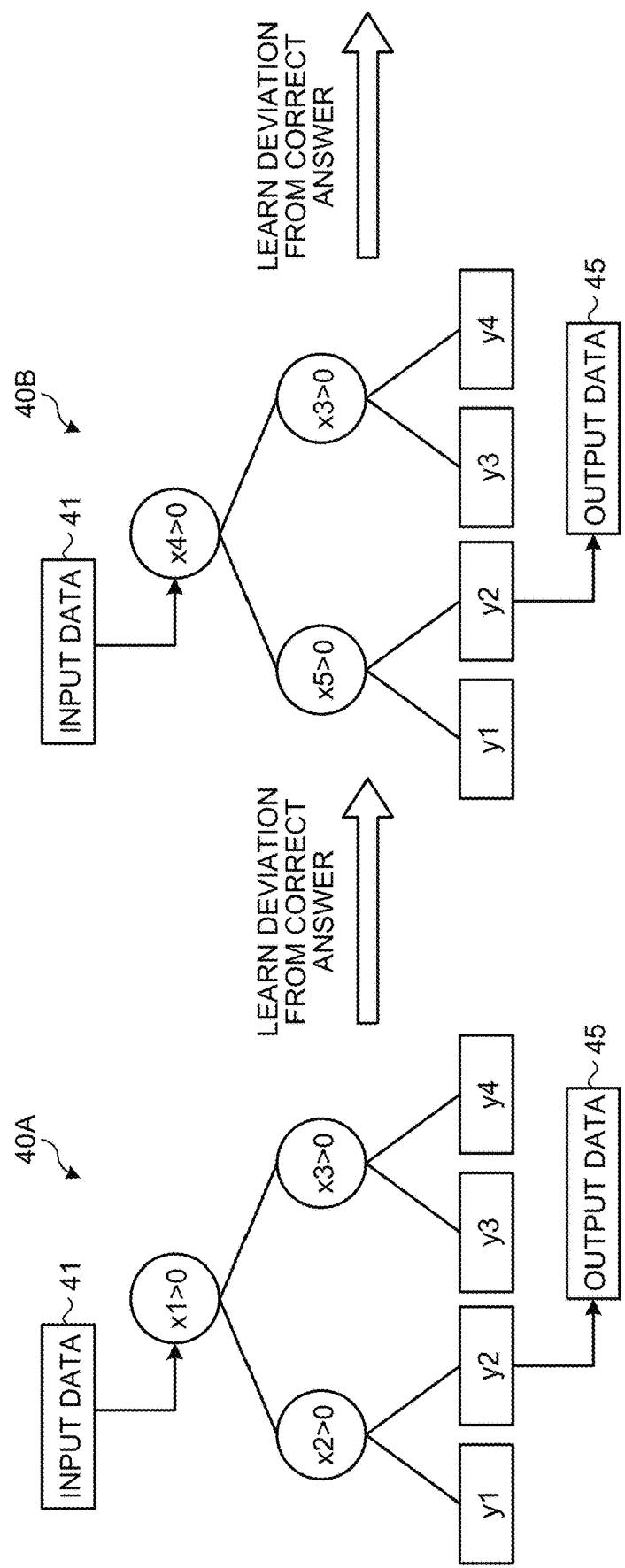
FIG. 4 illustrates gradient boosting used by the machine learning apparatus according to the embodiment.

FIG. 4 illustrates the gradient boosting used by the machine learning apparatus according to the embodiment. The gradient boosting is a learning technique that minimizes an error (deviation) between an inference result of a weak learner (such as a decision tree with a smaller number of layers) and correct information. With only a weak learner like the decision tree 40A, there is an error between the output data 45, which is an inference result of the decision tree 40A, and actual correct information (label data).

When using the gradient boosting, the machine learning apparatus 1 learns this error as a target variable and corrects the weak learner for improved accuracy. The machine learning apparatus 1 makes smaller the error between the output data 45 and the actual correct information, for example, by correcting the decision tree 40A to a decision tree 40B.

For example, the machine learning apparatus 1 generates the decision tree 40B from the decision tree 40A by setting the decision tree 40B having x1>0 at the first-layer conditional branch of the decision tree 40A corrected to x4>0 and x2>0 at the second-layer conditional branch of the decision tree 40A corrected to x5>0. Thereafter, the machine learning apparatus 1 generates a new decision tree by correcting x4>0 to another branch condition at the first-layer conditional branch of the decision tree 40B and correcting x5>0 to another branch condition at the second-layer conditional branch of the decision tree 40B.

The machine learning apparatus 1 repeats the decision tree generation that involves the branch condition correction to decrease the error between the output data 45 and the actual correct information. Consequently, the machine learning apparatus 1 can obtain a decision tree with a much smaller difference between the output data 45 and the actual correct information.

The gradient boosting is the technique that improves the accuracy of the weak learner through a plurality of error learnings such that the error between the output data 45 output from the generated decision tree and the actual correct information becomes as small as possible. The gradient boosting with respect to decision trees is called gradient tree boosting.

Figure 5:
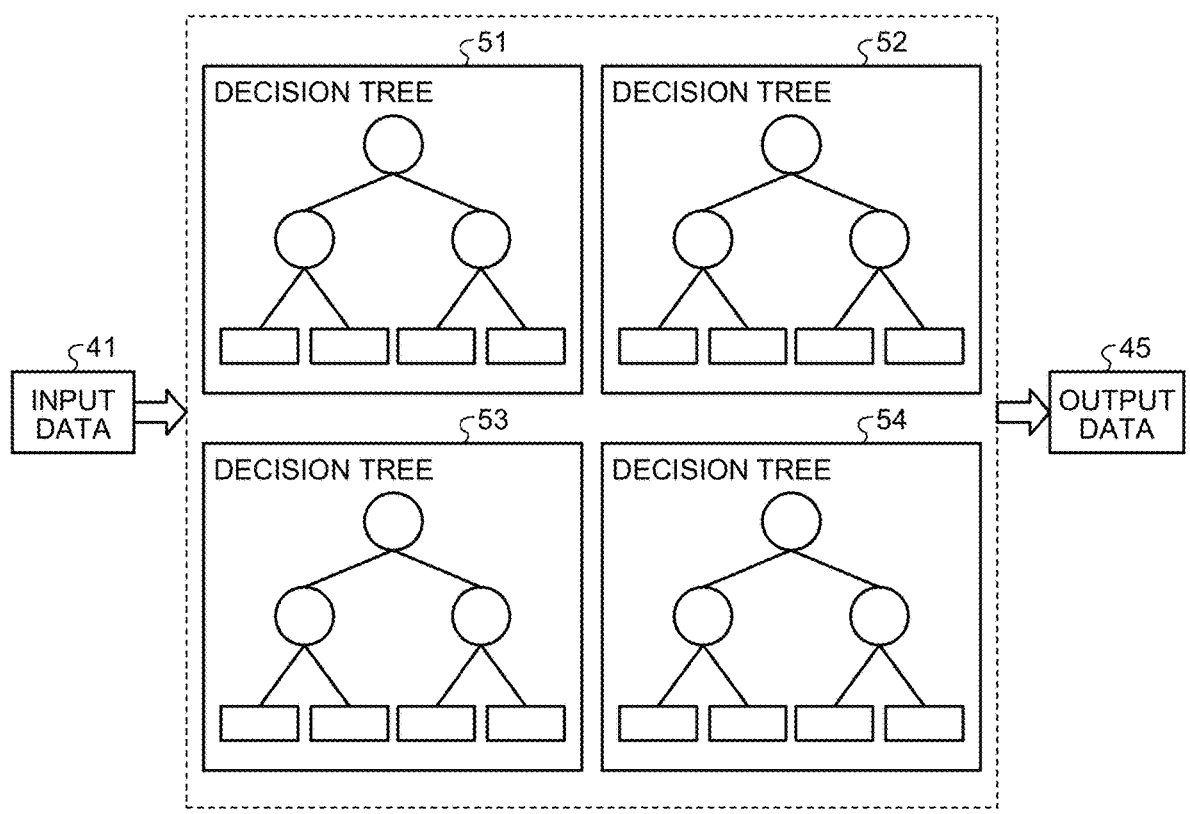
FIG. 5 illustrates a random forest used by the machine learning apparatus according to the embodiment.

FIG. 5 illustrates the random forest used by the machine learning apparatus according to the embodiment. When using the random forest, the machine learning apparatus 1 uses a plurality of the above-mentioned decision trees and decides by majority, thus improving accuracy of an inference result. A description is provided of a case where the machine learning apparatus 1 uses four decision trees 51 to 54 in FIG. 5. The decision trees 51 to 54 are similar to the decision tree 40A.

When using the random forest, the machine learning apparatus 1 creates the decision trees 51 to 54 by performing a plurality of times an operation of obtaining the input data 41 randomly and creating the decision tree. With the use of the decision trees 51 to 54, the machine learning apparatus 1 can select classification methods of various patterns. An inference result is therefore more accurate than when classification is performed using a single decision tree. The machine learning apparatus 1 applies the decision tree 51, 52, 53, or 54 to the input data 41 and outputs a result of the majority decision from the decision trees 51 to 54 as the output data 45.

The machine learning apparatus 1 may use any of supervised learning algorithms including a least squares method, a stepwise method, a support-vector machine (SVM), a neural network, and the like as the supervised learning algorithm. Since these supervised learning algorithms, the above-described learning algorithms using decision trees, and other supervised learning algorithms are well known, detailed descriptions of these algorithms are omitted herein.

A description is provided here of a specific configuration of the machine learning apparatus 1 and an alarm factor inference procedure. FIG. 6 illustrates the configuration of the machine learning apparatus according to the embodiment. The machine learning apparatus 1 is connected to a motor drive device 2 and an alarm management device 6. The machine learning apparatus 1 obtains driving data feature amounts from the motor drive device 2 and information including alarm factors and others from the alarm management device 6.

The machine learning apparatus 1 is implemented, for example, as an information processor connected to the motor drive device 2, such as a computer. The machine learning apparatus 1 includes a state observation unit 10, a learning unit 11, a learning result storage unit 12, an alarm inference unit 13, the individual inference unit 14, a model update unit 15, and an inferred result output unit 16.

The motor drive device 2 drives a motor which is not illustrated. The motor drive device 2 includes a data acquisition unit 21, a feature extraction unit 22, and a nonvolatile memory 23. The alarm management device 6 receives the alarm factors input by the worker. The alarm management device 6 includes an input unit 61, a storage unit 62, and an output unit 63.

The data acquisition unit 21 of the motor drive device 2 obtains physical quantities (in data form) such as detected current values, speed command values, output voltage values, and estimated speed values from an amplifier and others and sends these physical quantities to the feature extraction unit 22. The data acquisition unit 21 obtains a date and time of an alarm, a name of the alarm, and alarm details along with the physical quantities when the alarm has occurred. The data acquisition unit 21 also obtains detail design data from within the motor drive device 2 and stores the detail design data in the nonvolatile memory 23.

The feature extraction unit 22 extracts the driving data feature amount from the physical quantities obtained by the data acquisition unit 21. The feature extraction unit 22 may convert the driving data feature amounts into numerals, using a general statistical method or extract the driving data feature amount by dimensionality reduction using convolution.

The nonvolatile memory 23 stores the driving data feature amount extracted by the feature extraction unit 22. Specifically, the nonvolatile memory 23 stores feature information that has the driving data feature amount, the date and time of the alarm, the name of the alarm, and the alarm details, all of which are associated with one another. The nonvolatile memory 23 also stores detail design information that has the detail design data, the date and time of the alarm, the name of the alarm, and the alarm details, all of which are associated with one another.

The nonvolatile memory 23 has a function of outputting the feature information including the driving data feature amount, to the machine learning apparatus 1 and the alarm management device 6. The nonvolatile memory 23 also has a function of outputting the detail design information including the detail design data, to the machine learning apparatus 1. The nonvolatile memory 23 may be a cloud server external to the motor drive device 2.

The input unit 61 of the alarm management device 6 reads the feature information including the driving data feature amount, from the nonvolatile memory 23. The driving data feature amount may be transmitted to the input unit 61 by the nonvolatile memory 23.

The input unit 61 of the alarm management device 6 also receives the alarm factor and an alarm factor resolving parameter that are input by the worker. The alarm factor resolving parameter is a factor parameter that resolves the alarm. In other words, the alarm factor resolving parameter is what the worker is to work on to resolve the alarm.

The worker enters the alarm factor and the alarm factor resolving parameter into the input unit 61 in light of the feature information stored in the alarm management device 6. The input unit 61 stores, in the storage unit 62, alarm information that has the alarm factor, the alarm factor resolving parameter, and information that identifies the alarm, all of which are associated with one another. The information that identifies the alarm, that is to say, the alarm identification information is, for example, the alarm's date and time, which is included in the feature information.

The storage unit 62 is, for example, a memory that stores the alarm information. The output unit 63 sends the alarm information stored in the storage unit 62, to the state observation unit 10. The alarm information may be read by the machine learning apparatus 1 from the storage unit 62.

The state observation unit 10 observes the driving data feature amount as the state variable by reading, from the nonvolatile memory 23, the feature information including the driving data feature amount. The feature information may be transmitted to the state observation unit 10 by the nonvolatile memory 23.

The state observation unit 10 also reads, from the alarm management device 6, the alarm information that corresponds to the driving data feature amount. In doing so, the state observation unit 10 reads, from the alarm management device 6, the alarm information that corresponds to the alarm identification information included in the feature information. In this way, the state observation unit 10 observes the alarm factor, which is included in the alarm information, as a target variable. The state observation unit 10 associates the driving data feature amount with the alarm factor on the basis of the alarm identification information. The state observation unit 10 sends, to the learning unit 11, a dataset of the driving data feature amount and the alarm factor. This dataset is sent to the leaning unit 11 as training data.

The state observation unit 10 may change the driving data feature amount to obtain, for each motor control method. In other words, the state observation unit 10 may obtain the driving data feature amount corresponding to the motor control method. Examples of the motor control method include vector control, sensorless vector control, voltage/frequency control (V/f control), and advanced flux vector control (AD flux control). In the V/f control, a voltage corresponding to a frequency is output.

When the motor control method is the vector control or the sensorless vector control, the state observation unit 10 obtains the driving data feature amount including at least one of a detected speed value, an estimated speed value, and a speed command value. When the motor control method is neither the vector control nor the sensorless vector control, the state observation unit 10 obtains the driving data feature amount including at least one of an output voltage value and a detected current value.

The learning unit 11 performs the supervised learning. When the machine learning apparatus 1 is set at the learning stage, the learning unit 11 performs the supervised learning and stores a result of learning, namely, a learning model in the learning result storage unit 12. Having the input driving data feature amount as the state variable and the input alarm factor as the target variable, the learning unit 11 according to the present embodiment performs the supervised learning.

Using the driving data feature amount extracted from the physical quantities that have been obtained when the alarm occurs in the motor drive device 2, the learning unit 11 learns the alarm factor. Since the nonvolatile memory 23 stores the driving data feature amount, the learning unit 11 may learn an alarm factor, using a past driving data feature amount. In that case, the learning unit 11 learns the alarm factor, using the past alarm factor that corresponding to the past driving data features.

FIG. 7 illustrates alarm factors given as examples used by the machine learning apparatus according to the embodiment. FIG. 7 illustrates correspondence information having "alarm date and time", "generated alarm", "alarm details", "alarm factor", and "alarm factor resolving parameter", all of which are associated with one another.

The "alarm date and time" refers to a date and time of an alarm. The "generated alarm" refers to an alarm name. The "alarm details" refers to details of an alarm.

The "alarm details" are, for example, overcurrent during acceleration of a motor (overcurrent during the acceleration). The "alarm factor" is, for example, the motor acceleration time period having been set shorter relative to a load. The "alarm factor resolving parameter" is, for example, the acceleration time of the motor. When the overcurrent during the motor acceleration occurs, for example, because the acceleration time of the motor has been set shorter relative to the load, the alarm is resolvable by making the acceleration time of the motor longer.

When an alarm occurs in the motor drive device 2, the worker, who deals with the alarm, then enters an alarm factor and an alarm factor resolving parameter into the input unit 61 of the alarm management device 6. The alarm management device 6 may be internal to the machine learning apparatus 1 or the motor drive device 2. The worker may enter the alarm factor and the alarm factor resolving parameter into the alarm management device 6 when dealing with the alarm or, for example, later during an alarm analysis. The correspondence information may be created by the state observation unit 10 or the learning unit 11.

The learning unit 11 enters one set into the learning model, the one set being a set of the alarm factor and the driving data feature amount generated from the physical quantities obtained when the alarm corresponding to this alarm factor has occurred. More specifically, the learning unit 11 enters the one set into the learning model, the one set being a set of the alarm factor and the driving data feature amount extracted from the physical quantities obtained in response to occurrence of the alarm caused by the alarm factor during a specified period of time.

As discussed above, the learning unit 11 can employ the supervised learning procedure by entering the driving data feature amount and the alarm factor. In this case, the learning unit 11 infers the alarm factor for the driving data feature amount, using the Extreme Gradient Boosting. The learning unit 11 stores the learning model, which is the result of learning, in the learning result storage unit 12.

The learning result storage unit 12 is, for example, a memory that stores the learning result (learning model) which the learning unit 11 learns on the basis of the training data. This learning result stored in the learning result storage unit 12 may be installed on a device external to the machine learning apparatus 1 or may be transmitted to an external device. The external device can infer an alarm factor by entering a driving data feature amount into the learning result provided by the learning unit 11. The learning result storage unit 12 may store the correspondence information illustrated in FIG. 7.

At the inference stage, the alarm inference unit 13 infers an alarm factor from a driving data feature amount on the basis of the learning result stored in the learning result storage unit 12. In this case, the alarm inference unit 13 obtains the driving data feature amount from the motor drive device 2. The driving data feature amount may be read from the nonvolatile memory 23 by the alarm inference unit 13 or transmitted to the alarm inference unit 13 by the nonvolatile memory 23. The alarm inference unit 13 outputs the inferred alarm factor to the individual inference unit 14.

The alarm factor inferred by the alarm inference unit 13 and the detail design information stored in the nonvolatile memory 23 are input to the individual inference unit 14. On the basis of the alarm factor inferred by the alarm inference unit 13 and the detail design data when an alarm has occurred, the individual inference unit 14 determines whether or not the inferred alarm factor needs to be corrected. If the alarm factor needs to be corrected, the individual inference unit 14 corrects the inferred alarm factor on the basis of the inferred alarm factor and the detail design data when the alarm has occurred. The individual inference unit 14 sends a corrected alarm factor to the model update unit 15.

The model update unit 15 stores an inference error that is a part of the alarm factor, the part being corrected by the individual inference unit 14. The model update unit 15 feeds the inference error back to the learning unit 11 and causes the learning unit 11 to update the learning model.

When the inferred result output unit 16 obtains from the individual inference unit 14 the alarm factor (inference result) corrected by the individual inference unit 14, the inferred result output unit 16 obtains, from the correspondence information in the learning result storage unit 12, an alarm factor resolving parameter that corresponds to the obtained alarm factor.

The inferred result output unit 16 outputs the corrected alarm factor and the alarm factor resolving parameter to a display device or the like. As a result, the alarm factor and the alarm factor resolving parameter are displayed, for example, on the display device. The worker sets the displayed alarm factor resolving parameter, for example, in the motor drive device 2, thereby resolving the alarm.

The alarm factor that the state observation unit 10 obtains is a first alarm factor and corresponds to the alarm factor 32A described in relation to FIG. 1. The alarm factor inferred with the learning model generated by the learning unit 11, that is to say, the alarm factor inferred by the alarm inference unit 13 is a second alarm factor and corresponds to the alarm factor 32B described in relation to FIG. 2. The alarm factor inferred by the alarm inference unit 13 is a new alarm factor corresponding to a new feature amount when a new alarm has occurred.

The alarm factor that the individual inference unit 14 corrects on the basis of the change information is the second alarm factor, and the corrected alarm factor is a third alarm factor. The third alarm factor corresponds to the alarm factor 32C described in relation to FIG. 2.

When the learning unit 11 generates or updates the learning model with an increased weight of the alarm factor corresponding to the parameter set value included in the change information, this alarm factor is a third alarm factor. In this case the learning unit 11 uses such a third alarm factor as the first alarm factor for generating or updating the learning model. The learning unit 11 generates or updates the learning model when an anomaly that is the third alarm factor occurs and is subsequently resolved by a change to the parameter set value.

Figure 8:
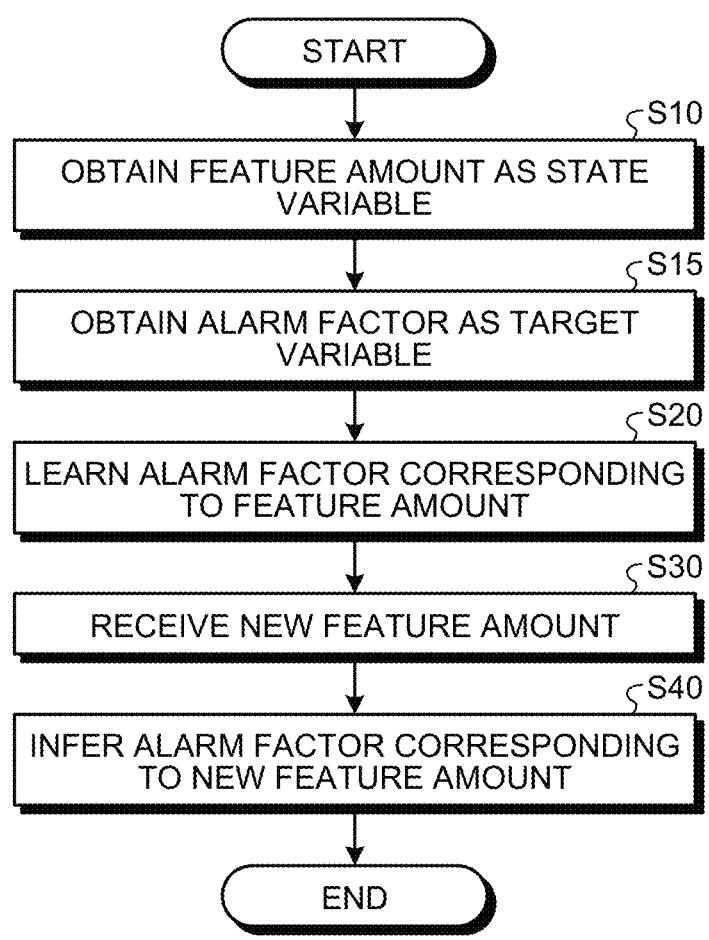
FIG. 8 is a flowchart illustrating a processing procedure that the machine learning apparatus according to the embodiment follows for inferring an alarm factor.

A description is provided next of the alarm factor inference procedure of the machine learning apparatus 1. FIG. 8 is a flowchart illustrating the procedure the machine learning apparatus according to the embodiment follows for inferring an alarm factor.

When an alarm occurs, the state observation unit 10 of the machine learning apparatus 1 obtains a feature amount corresponding to the alarm, as a state variable (step S10). The state observation unit 10 also obtains an alarm factor corresponding to the alarm, as a target variable (step S15).

Having the input feature amount as the state variable and the input alarm factor as the target variable, the learning unit 11 performs the supervised learning. In other words, the learning unit 11 learns the alarm factor that corresponds to the feature amount (step S20). Specifically, the learning unit 11 learns the alarm factor by setting a dataset of the feature amount and the alarm factor, as training data for a learning model.

When a new alarm occurs after the learning model is learned, the alarm inference unit 13 receives a new feature amount corresponding to the new alarm (step S30). The alarm inference unit 13 enters the new feature amount into the learned learning model, thereby inferring an alarm factor that corresponds to the new feature amount (step S40). The machine learning apparatus 1 performs processing of steps S10, S15, and S20 at the learning stage and performs processing of steps S30 and S40 at the inference stage.

Since the machine learning apparatus 1 obtains the feature amount extracted from the physical quantities, and the alarm factors, as discussed above, the machine learning apparatus 1 can quickly generate the learning model for inferring the alarm factor before a breakdown occurs. In other words, the machine learning apparatus 1 can quickly generate the learning model for inferring an alarm factor caused not by a physical breakdown of components, etc., but by a manner of the use. Consequently, the machine learning apparatus 1 can infer the alarm factor before a breakdown occurs. In other words, the machine learning apparatus 1 can infer the alarm factor caused by the manner of the use. The worker can therefore deal with an alarm on the basis of the alarm factor. As a result, the machine learning apparatus 1 can reduce downtime of equipment when the alarm occurs.

Other methods for inferring an alarm factor include, for example, a worker checking a state or parameters of a motor drive device, and a worker monitoring information on input to and output from the motor drive device. Since these other methods rely on experience of the worker who infers the alarm factor, speed or accuracy of the alarm factor identification varies depending on the worker's experience and the like. Moreover, to identify an alarm factor behind an alarm, such as to determine whether the alarm comes from wrong setting in the motor drive device, a higher load, or an equipment anomaly, requires sufficient input data, which needs a considerable amount of time.

There is also a method of inferring anomaly on the basis of sound, vibration, and current values. Unfortunately, such a method fails to infer the anomaly with high accuracy because it is difficult to obtain sufficient input data in order to determine a rotary device such as a motor drive device. A still another method is to obtain internal parameters of a machine learning apparatus by performing machine learning using state variables when an anomaly occurs and state variables when no anomaly occurs. For this method, the machine learning apparatus diagnoses the anomaly, using the internal parameters. For even such a method, unfortunately, it is difficult to obtain sufficient input data in order to determine a state of a rotary device such as a motor drive device.

Figure 9:
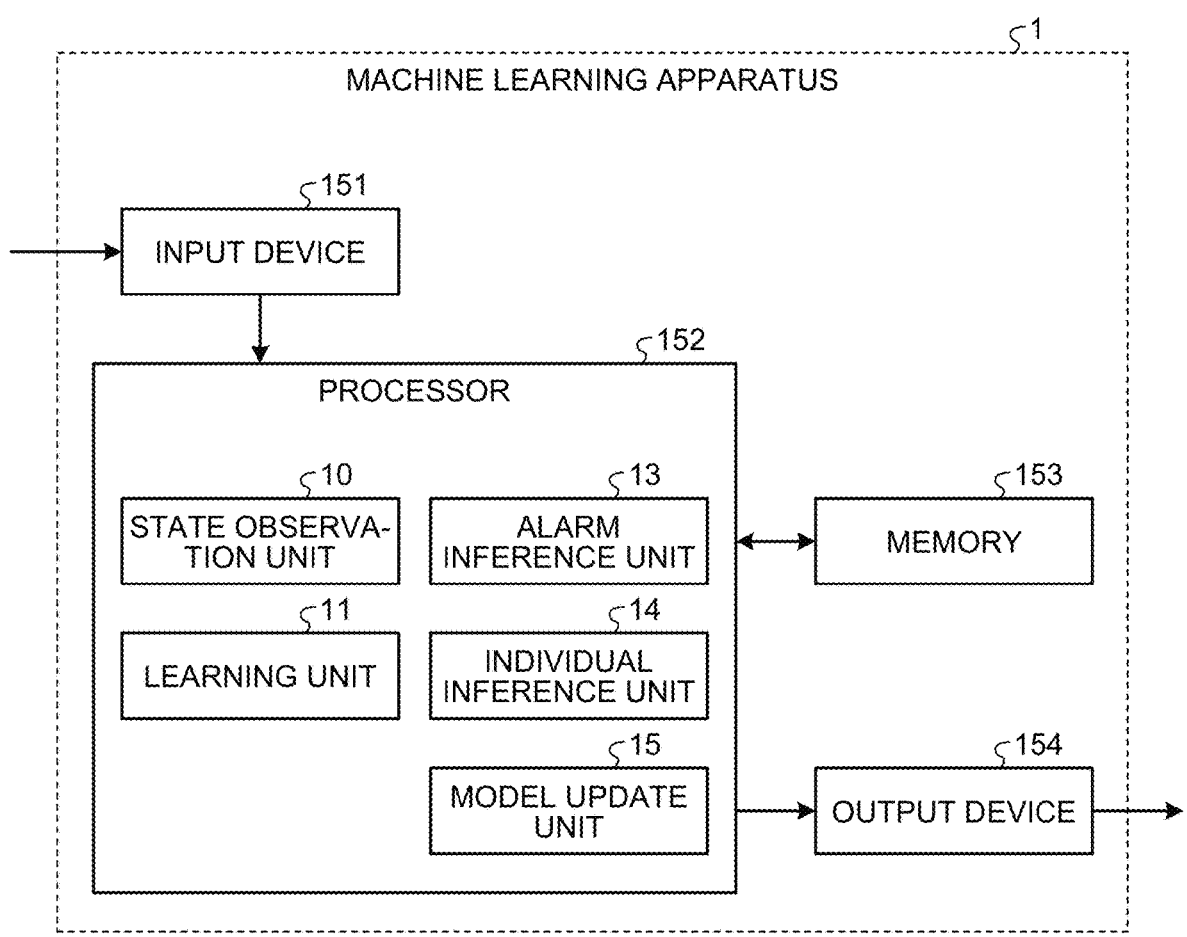
FIG. 9 illustrates an example of a hardware configuration that implements the machine learning apparatus according to the embodiment.

A description is provided here of a hardware configuration of the machine learning apparatus 1. FIG. 9 illustrates an example of the hardware configuration that implements the machine learning apparatus according to the embodiment.

The machine learning apparatus 1 is implementable with the use of an input device 151, a processor 152, a memory 153, and an output device 154. Examples of the processor 152 include a central processing unit (CPU) that is also referred to as a processing unit, an arithmetic unit, a microprocessor, a microcomputer, or a digital signal processor (DSP) and a system large-scale integration (LSI). Examples of the memory 153 include a random-access memory (RAM) and a read-only memory (ROM).

The machine learning apparatus 1 is implemented as the processor 152 reads and executes a computer-executable learning program that is stored in the memory 153 and runs the machine learning apparatus 1. The learning program that runs the machine learning apparatus 1 can be said to cause a computer to perform the procedure or method of the machine learning apparatus 1.

The learning program for the machine learning apparatus 1 is configured to include the state observation unit 10, the learning unit 11, the alarm inference unit 13, the individual inference unit 14, and the model update unit 15 as modules. These modules are generated in main memory by being loaded.

The input device 151 receives and outputs, to the processor 152, the feature information that includes the driving data features, the alarm information that includes the alarm factor, the detail design information, and others. When the processor 152 performs the various steps, the memory 153 is used as a temporary memory. The memory 153 stores the learning model, the correspondence information, and others. The output device 154 outputs the alarm factor and the alarm factor resolving parameter that correspond to the alarm to an external device such as a display device.

The learning program may be provided as a computer program product that is stored as an installable or executable file in a computer-readable storage medium. The learning program may be provided for the machine learning apparatus 1 via a network such as the Internet. Some of the functions of the machine learning apparatus 1 may be implemented with dedicated hardware such as a dedicated circuit, while some of the other functions may be implemented with software or firmware.

While the machine learning apparatus 1 described in the present embodiment follows the learning and inference procedure that uses physical quantities, feature amounts, and training data with respect to the single motor drive device 2 for the purpose of convenience, the present embodiment is not limited to this procedure. For example, the machine learning apparatus 1 is capable of promoting efficient learning and inference by performing learning and inference, collecting physical quantities, feature amounts, and training data with respect to a plurality of the motor drive devices 2 in a plant or multiple sites. In other words, the machine learning apparatus 1 is capable of efficient alarm factor learning by having the plurality of the motor drive devices 2 as learning targets.

While the machine learning apparatus 1 described in the present embodiment includes the learning unit 11, the machine learning apparatus 1 does not have to be equipped with the learning unit 11 when another machine learning apparatus stores its result of learning in the learning result storage unit 12. In other words, the machine learning apparatus including the learning unit 11 and the machine learning apparatus including the alarm inference unit 13 may be provided separately.

According to the embodiment described above, the state observation unit 10 obtains the state variable, namely, the feature amount of the physical quantities such as the detected current value from the motor drive device 2, and obtains the target variable, namely, the alarm factor corresponding to the feature amount created. The learning unit 11 generates, from the dataset created on the basis of a combination of the state variable and the target variable (label data), the learning model for inferring the alarm factor. Therefore, the machine learning apparatus 1 can therefore generate the learning model for inferring the alarm factor caused not by the breakdown of a component and the like but by the manner of the use.

Since the machine learning apparatus 1 includes the individual inference unit 14 that corrects the alarm factor inferred by the alarm inference unit 13 on the basis of the detail design data, the machine learning apparatus 1 can diagnose the alarm factor corresponding to the driving data features, with improved accuracy.

Since storing every feature amount when an alarm occurs results in a mass of data in the nonvolatile memory 23, a limited number of feature amounts are obtained for each motor control method. This enables the nonvolatile memory 23 to store an increased number of pieces of training data, such that the machine learning apparatus 1 improves the accuracy of inference of the alarm factor.

The above configurations illustrated in the embodiment are illustrative, can be combined with other techniques that are publicly known or another embodiment, and can be partly omitted or changed without departing from the gist.

REFERENCE SIGNS LIST

1 machine learning apparatus; 2 motor drive device; 6 alarm management device; 10 state observation unit; 11 learning unit; 12 learning result storage unit; alarm inference unit; 14 individual inference unit; 15 model update unit; 16 inferred result output unit; 21 data acquisition unit; 22 feature extraction unit; 23 nonvolatile memory; 31A, 31B driving data feature; 32A, 32B, 32C alarm factor; 33 detail design data; 40A, 40B, 51 to 54 decision tree; 41 input data; 45 output data; 61 input unit; 62 storage unit; 63 output unit; 151 input device; 152 processor; 153 memory; 154 output device.

The invention claimed is:

1. A machine learning apparatus to learn an alarm factor in a motor drive device to drive a motor, the machine learning apparatus comprising:
   state observation circuitry to obtain a feature amount as a state variable from the motor drive device and an alarm factor as label data, the alarm factor corresponding to the feature amount, the feature amount including at least one of a detected current value detected from the motor, a speed command value specifying a rotational speed of the motor, an output voltage value output to the motor, an estimated speed value indicating an estimated rotational speed of the motor, and a detected speed value indicating a detected rotational speed of the motor;
   learning circuitry to generate a learning model for inferring a new alarm factor corresponding to a new feature amount, from a dataset created on a basis of a combination of the state variable and the label data;
   alarm inference circuitry to, when obtaining a new feature amount, infer a new alarm factor corresponding to new feature amount, by applying the learning model to the new feature amount; and
   correction circuitry to correct an alarm factor inferred by the alarm inference circuitry, on a basis of detail design data including at least one of a parameter set value set in the motor drive device, a driving condition of the motor drive device, and internal data on an amplifier to amplify power output from the motor drive device, wherein the parameter set value comprises a plurality of parameter set values, and the detail design data includes change information indicating, among the parameter set values, a parameter set value changed before an anomalous operation, and the correction circuity corrects, on a basis of the change information, the alarm factor inferred by the alarm inference circuitry.

2. The machine learning apparatus according to claim 1, further comprising model update circuitry to update the learning model on a basis of a result of correction by the correction circuitry.

3. The machine learning apparatus according to claim 2, wherein the state observation circuitry obtains a feature amount corresponding to a control method for the motor.

4. The machine learning apparatus according to claim 3, wherein the state observation circuitry obtains a feature amount including at least one of the detected speed value, the estimated speed value, and the speed command value when the control method for the motor is vector control or sensorless vector control and obtains a feature amount including at least one of the output voltage value and the detected current value, when the control method for the motor is neither the vector control nor the sensorless vector control.

5. The machine learning apparatus according to claim 1, wherein the state observation circuit obtains a feature amount corresponding to a control method for the motor.

6. The machine learning apparatus according to claim 5, wherein the state observation circuitry obtains a feature amount including at least one of the detected speed value, the estimated speed value, and the speed command value when the control method for the motor is vector control or sensorless vector control and obtains a feature amount including at least one of the output voltage value and the detected current value, when the control method for the motor is neither the vector control nor the sensorless vector control.

7. The machine learning apparatus according to claim 1, wherein the learning circuitry generates or updates the learning model, increasing a weight of an alarm factor corresponding to a parameter set value of the change information.

8. The machine learning apparatus according to claim 7, wherein the learning circuitry generates or updates the learning model when an anomaly that is the alarm factor occurs and is subsequently resolved by a change to the parameter set value.

9. A machine learning method of learning an alarm factor in a motor drive device to drive a motor, the machine learning method comprising:

obtaining a feature amount as a state variable from the motor drive device and an alarm factor as label data, the alarm factor corresponding to the feature amount, the feature amount including at least one of a detected current value detected from the motor, a speed command value specifying a rotational speed of the motor, an output voltage value output to the motor, an estimated speed value indicating an estimated rotational speed of the motor, and a detected speed value indicating a detected rotational speed of the motor;

generating a learning model for inferring a new alarm factor corresponding to a new feature amount, from a dataset created on a basis of a combination of the state variable and the label data;

when obtaining a new feature amount, inferring a new alarm factor corresponding to new feature amount, by applying the learning model to the new feature amount; and correcting an inferred alarm factor on a basis of detail design data including at least one of a parameter set value set in the motor drive device, a driving condition of the motor drive device, and internal data on an amplifier to amplify power output from the motor drive device, wherein the parameter set value comprises a plurality of parameter set values, and the detail design data includes change information indicating, among the parameter set values, a parameter set value changed before an anomalous operation, and correcting the inferred alarm factor includes correcting the inferred alarm factor on a basis of the change information.

* * * * *